United States Patent
Kobayashi et al.

(10) Patent No.: US 10,575,412 B2
(45) Date of Patent: Feb. 25, 2020

(54) ELECTROCONDUCTIVE PASTE, ELECTRONIC SUBSTRATE, AND METHOD FOR MANUFACTURING SAID SUBSTRATE

(71) Applicant: Mitsuboshi Belting Ltd., Kobe-shi, Hyogo (JP)

(72) Inventors: Hiroji Kobayashi, Hyogo (JP); Yoko Hayashi, Hyogo (JP)

(73) Assignee: Mitsuboshi Belting Ltd., Kobe-shi, Hyogo (JP)

( * ) Notice: Subject to any disclaimer, the term of this patent is extended or adjusted under 35 U.S.C. 154(b) by 0 days.

(21) Appl. No.: 16/089,229

(22) PCT Filed: Dec. 27, 2016

(86) PCT No.: PCT/JP2016/088929
§ 371 (c)(1),
(2) Date: Sep. 27, 2018

(87) PCT Pub. No.: WO2018/122971
PCT Pub. Date: Jul. 5, 2018

(65) Prior Publication Data
US 2019/0132961 A1   May 2, 2019

(51) Int. Cl.
| | |
|---|---|
| H05K 1/09 | (2006.01) |
| H05K 3/38 | (2006.01) |
| H01B 1/22 | (2006.01) |
| H05K 1/03 | (2006.01) |
| H05K 3/12 | (2006.01) |
| H05K 1/11 | (2006.01) |
| H01B 1/02 | (2006.01) |

(52) U.S. Cl.
CPC ............ *H05K 3/389* (2013.01); *H01B 1/026* (2013.01); *H01B 1/22* (2013.01); *H05K 1/0306* (2013.01); *H05K 1/09* (2013.01); *H05K 1/115* (2013.01); *H05K 3/12* (2013.01); *H05K 3/1283* (2013.01); *H05K 2201/0272* (2013.01); *H05K 2203/086* (2013.01)

(58) Field of Classification Search
CPC ...................................................... H05K 1/092
See application file for complete search history.

(56) References Cited

U.S. PATENT DOCUMENTS

| | | | |
|---|---|---|---|
| 5,793,276 A | 8/1998 | Tosaka et al. | |
| 5,807,626 A | 9/1998 | Naba | |
| 2002/0155286 A1* | 10/2002 | Kobayashi | C08G 59/504 428/355 EP |
| 2009/0139754 A1 | 6/2009 | Ikarashi et al. | |
| 2011/0049439 A1 | 3/2011 | Higuchi et al. | |
| 2012/0248483 A1* | 10/2012 | Beppu | H01L 33/505 257/98 |
| 2013/0001199 A1 | 1/2013 | Takahashi | |
| 2013/0186675 A1 | 7/2013 | Takahashi et al. | |
| 2013/0299219 A1 | 11/2013 | Chisaka et al. | |
| 2014/0290863 A1 | 10/2014 | Watanabe et al. | |
| 2015/0299477 A1* | 10/2015 | Yoshii | C09D 5/24 174/257 |
| 2017/0358381 A1 | 12/2017 | Nakazono et al. | |

FOREIGN PATENT DOCUMENTS

| | | |
|---|---|---|
| CN | 101878509 A | 11/2010 |
| CN | 103228102 A | 7/2013 |
| CN | 103692105 A | 4/2014 |
| JP | H01-137516 A | 5/1989 |
| JP | H01-206508 A | 8/1989 |
| JP | H05-156303 A | 6/1993 |
| JP | H05-226515 A | 9/1993 |
| JP | H06-349315 A | 12/1994 |
| JP | H07-230714 A | 8/1995 |
| JP | H09-036540 A | 2/1997 |
| JP | 2967929 B2 | 10/1999 |
| JP | 2000-246482 A | 9/2000 |
| JP | 2009-059648 A | 3/2009 |
| JP | 2011-181736 A | 9/2011 |
| JP | 2012-250240 A | 12/2012 |
| JP | 2016-193449 A | 11/2016 |
| TW | 312794 B | 8/1997 |
| TW | 201336802 A | 9/2013 |
| TW | 201643894 A | 12/2016 |
| WO | 2007-072894 A1 | 6/2007 |
| WO | 2012-111711 A1 | 8/2012 |
| WO | 2015-060173 A1 | 4/2015 |

OTHER PUBLICATIONS

Feb. 28, 2017—International Search Report—Intl App PCT/JP2016/088929.
Jul. 6, 2017—(TW) Office Action—App 105143425—Eng Tran.
Mar. 5, 2018—(TW) Office Action—App 105143425—Eng Tran.
May 29, 2018—(JP) Notification of Reasons for Refusal—App 2016-179636—Eng Tran.
Jul. 31, 2018—(JP) Notification of Reasons for Refusal—App 2016-179636—Eng Tran.
Sep. 2, 2019—(KR) Office Action—App 10-2018-7027624, Eng Tran.
Sep. 2, 2019—(EP) Extended Search Report—App 16925406.7.
Apr. 10, 2018—(CN) Notification of First Office Action—App 201680084127.3, Eng Tran.
Nov. 4, 2019—(CN) Notification of the Second Office Action—App 201680084127.3, Eng Tran.
Oct. 8, 2019—(JP) Notificaton of Reasons for Refusal—App 2017-240690, Eng Tran.
Dec. 17, 2019—(JP) Decision of Refusal—App 2017-240690, Eng Tran.

* cited by examiner

*Primary Examiner* — Jeremy C Norris
(74) *Attorney, Agent, or Firm* — Banner & Witcoff, Ltd.

(57) ABSTRACT

An electroconductive paste comprises high melting point metal particles having a melting point that exceeds the firing temperature; molten metal particles containing a metal or an alloy that melts at the firing temperature, for which the melting point is 700° C. or less; active metal particles containing an active metal; and an organic vehicle.

18 Claims, No Drawings

ELECTROCONDUCTIVE PASTE, ELECTRONIC SUBSTRATE, AND METHOD FOR MANUFACTURING SAID SUBSTRATE

CROSS REFERENCE TO RELATED APPLICATIONS:

This is a U.S. National Phase Application under 35 U.S.C. § 371 of International Application No. PCT/JP2016/088929, filed Dec. 27, 2016, which was published Under PCT Article 21(2), the entire contents of which are incorporated herein by reference.

TECHNICAL FIELD

The present invention relates to a conductive paste for producing an electronic substrate such as a surface metallized substrate, a via filling substrate or a through-hole wall-surface metallized substrate by forming a conductive part such as an electrode or a circuit on a ceramic substrate, an electronic substrate (ceramic substrate with a conductive part) obtained using this paste, and a method for producing the same.

BACKGROUND ART

Conventionally, as paste materials for forming electrodes or circuits on surfaces of ceramic substrates, conductive pastes obtained by mixing metal particles such as Ag, Cu, Ni and W and glass particles (powders) into organic vehicles have been generally known. The conductive paste of this type is used by printing a predetermined pattern thereof on the substrate surface by screen printing or the like, and thereafter heating it at a temperature equivalent to or higher than the softening point of the glass component and equivalent to or lower than the melting point of the metal in a baking step. That is, in this paste, the glass component melted and softened by heating wets the ceramic substrate to cause bonding of the paste and the substrate, and the metal powders are sintered to one another, thereby forming a conductive part. Such glass particle-containing conductive pastes have been widely used in the field of electronics industry for the production of electronic components or circuit substrates from their easy handling. However, it cannot be denied that the bonding with the glass component is inferior in bonding strength to another bonding method. In particular, the glass component is difficult to wet the ceramic substrate such as an aluminum nitride substrate or a silicon nitride substrate, which is often used for the purpose of heat radiation of a high-power semiconductor, and it has been difficult to obtain the sufficient bonding strength. Therefore, in an application requiring high reliability, there is often used a thin film method by sputtering, a method of adhering a metal foil or a metal plate to a substrate using an active brazing metal, or the like. However, these metallizing methods are high in cost, and in the paste printing method requiring low cost, an improvement request for the bonding strength has still been strong.

Patent Document 1 discloses a metallizing method of strongly bonding an aluminum nitride substrate and a metallizing layer by adding a Ti compound (titanium hydride) as an active metal species into a conductive paste mainly composed of an Ag—Cu alloy. This document describes that baking is performed by heating in a non-oxidizing atmosphere, an inert atmosphere or a vacuum atmosphere, in order to prevent decomposition and oxidation of the Ag—Cu alloy and titanium hydride, and the baking is performed in the vacuum atmosphere in Examples.

In this method, the particles of the active metal or the compound thereof are used in combination with a suitable melting component (the Ag—Cu alloy in many cases), because the active metal alone is difficult to react with the substrate surface. Therefore, the paste easily flows during the baking to make pattern formation of an electrode or wiring difficult, and is often used for an application such as sticking of metal plates. Further, when baked in vacuum, the substrate and the metallizing layer are strongly bonded, and the pattern formation tends to be easily retained. However, the Ag—Cu alloy melted during the baking is contracted to cause turning-up of an end of the pattern or becoming small and round on the substrate, resulting in a tendency to deform the pattern.

This tendency is remarkable particularly in the baking in the nitrogen atmosphere (non-oxidizing atmosphere). In the baking in the nitrogen atmosphere, the pattern is completely turned up or deformed into a ball shape, and becomes a state where a part slightly in contact is barely bonded to the substrate. It is assumed that this is why the baking is performed in vacuum in Examples in this Document. Accordingly, the paste of this Document may strongly bond the fine pattern shape of the electrode, the circuit or the like to the substrate by the vacuum baking. However, the vacuum baking is a batch type, and moreover, requires a very long time for temperature rise or temperature drop. This is therefore low in productivity. When conveyer transportation type nitrogen baking is performed in order to improve the productivity, the metallizing layer is contracted. It is therefore difficult to retain the fine pattern shape of the electrode, the circuit or the like.

Patent Document 2 discloses a brazing filler material paste containing Ag—Cu alloy particles and titanium particles whose surfaces are coated with copper, as metal components. This Document describes that conventional titanium hydride is decomposed at about 400 to 500° C. to hydrogen and titanium, and that titanium having high reactivity reacts with oxygen or carbon of a decomposed gas of organic materials contained in the paste to hinder bonding to a ceramic member.

In contrast, Patent Document 1 discloses that titanium hydride is stable up to 700° C. However, in any case, the baking temperature is as high as about 850° C., and therefore, when exposed to the gas such as oxygen, carbon or nitrogen during the baking, it cannot sufficiently function. Thus, the baking has usually been performed in the above-described vacuum containing no gas.

PRIOR ART DOCUMENTS

Patent Documents

Patent Document 1: JP-A-5-226515
Patent Document 2: JP-A-2000-246482

SUMMARY OF THE INVENTION

Problems to be Solved by the Invention

Accordingly, an object of the resent invention is to provide a conductive paste which can strongly bond a conductive part to a ceramic substrate, an electronic substrate obtained by using this paste, and a method for producing the same.

Another object of the present invention is to provide a conductive paste which can strongly bond a fine pattern to a ceramic substrate, even when baked in a nitrogen atmosphere, an electronic substrate obtained by using this paste, and a method for producing the same.

Means for Solving the Problems

In order to achieve the above-described objects, the present inventors have made intensive studies. As a result, it has been found that when a conductive paste in which a high melting point metal particle having a melting point exceeding a baking temperature, a molten metal particle containing a metal or an alloy which melts at a temperature equivalent to or lower than the baking temperature, an active metal particle containing an active metal and an organic vehicle are combined is applied to or filled in a ceramic substrate, followed by baking, a conductive part can be strongly bonded to a ceramic substrate, thus completing the present invention.

That is, the conductive paste of the present invention includes a high melting point metal particle having a melting point exceeding a baking temperature, a molten metal particle containing a metal or an alloy which melts at a temperature equivalent to or lower than the baking temperature and has a melting point of 700° C. or lower, an active metal particle containing an active metal, and an organic vehicle. The above-described molten metal particle may be a metal particle of at least one kind selected from the group consisting of In, Sn, Bi, Pb, Zn, Al, Sb and Mg, or an alloy particle containing at least one kind of these metal species. The above-described molten metal particle may contain at least one kind selected from the group consisting of an Sn—Ag—Cu alloy particle, an Sn—Bi alloy particle and an Au—Sn alloy particle. In the above-described active metal particle, the active metal may be Ti and/or Zr. The above-described active metal particle may be at least one kind selected from the group consisting of a titanium hydride particle, a titanium boride particle and zirconium hydride particle. The above-described high melting point metal particle may be formed by at least one kind of metal selected from the group consisting of Cu, Ag and Ni, or an alloy containing this metal. A mass ratio of the above-described high melting point metal particle and the above-described molten metal particle may be high melting point metal particle/molten metal particle=about 90/10 to 40/60. A ratio of the above-described active metal particle may be from about 0.5 to 30 parts by mass based on 100 parts by mass of total of the high melting point metal particle and the molten metal particle. A center particle size of the above-described molten metal particle may be from 0.01 to 30 μm. A center particle size of the above-described active metal particle may be from about 0.1 to 15 μm. A center particle size of the above-described high melting point metal particle may be from about 0.01 to 15 μm.

The present invention includes a method for producing an electronic substrate, the method including an adhesion step of adhering the above-described conductive paste to the ceramic substrate and a baking step of baking the above-described conductive paste adhered to the above-described ceramic substrate to form a conductive part. In the above-described baking step, the conductive paste may be baked in a non-oxidizing atmosphere or an inert atmosphere, and the conductive paste may be baked, for example, in a nitrogen atmosphere. In the above-described baking step, the baking temperature may be from about 800 to 950° C.

The present invention also includes an electronic substrate including a ceramic substrate and a conductive part containing a high melting point metal having a melting point equivalent to or higher than a baking temperature, a molten metal which contains a metal or alloy having a melting point of 700° C. or lower and an active metal. The above-described ceramic substrate may be an alumina substrate, an alumina-zirconia substrate, an aluminum nitride substrate, a silicon nitride substrate or a silicon carbide substrate. The electronic substrate of the present invention may be a surface metallized substrate, a via filling substrate or a through-hole wall-surface metallized substrate.

Advantageous Effects of the Invention

In the present invention, a high melting point metal particle having a melting point equivalent to or higher than a baking temperature, a molten metal particle containing a metal or an alloy which melts at a temperature equivalent to or lower than the baking temperature and has a melting point of 700° C. or lower, an active metal particle containing an active metal and an organic vehicle are combined, and therefore, a conductive part can be strongly bonded to a ceramic substrate. In particular, even when baked in a nitrogen atmosphere, the conductive part can be strongly bonded to the ceramic substrate without deforming a fine pattern shape.

MODE FOR CARRYING OUT THE INVENTION

[Conductive Paste]

The conductive paste of the present invention includes a high melting point metal particle having a melting point equivalent to or higher than a baking temperature, a molten metal particle containing a metal or an alloy which melts at a temperature equivalent to or lower than the baking temperature and has a melting point of 700° C. or lower, an active metal particle containing an active metal, and an organic vehicle. When the conductive paste of the present invention is used, a conductive part can be strongly bonded to a ceramic substrate. The reason for this can be assumed as follows. That is, it is assumed that the molten metal particles contained in the paste melt at low temperature and cover surfaces of the active metal particles, thereby preventing the active metal or the compound thereof from reacting with a gas existing in the periphery (nitrogen of a baking atmosphere gas or carbon generated by decomposition of the organic vehicle) even at high temperature. It can be assumed that by such a function, the active metal can keep its activity up to high temperature even in the nitrogen atmosphere, and that by containing the active metal keeping the activity in the molten metal component, the molten metal wets the ceramic substrate and makes it possible to react between the active metal and the ceramic substrate to also prevent turning-up or contraction of the metallized film. It can be assumed that a phenomenon of turning-up or rounded contraction of the pattern, a phenomenon of spreading of the pattern due to conversely excessive wetting to the substrate, or the like cannot be completely controlled, because the molten metal is liquefied and flows literally. Then, in the present invention, the phenomenon of contraction or spreading as described above is suppressed by adding the high melting point metal particles in addition to the molten metal particles and the active metal particle. That is, it can be assumed that the molten metal component also wets the surface of the high melting point metal particle, thereby preventing excessive flow. According to the kinds of molten metal and high melting point metal, it is also possible to suppress fluidization by utilizing an increase in the melting point of the molten metal caused by progress of alloying between the molten metal and the high melting point metal during the baking.

(High Melting Point Metal Particle)

The metal forming the high melting point metal particle is not particularly limited as long as it has a melting point (for example, higher than 950° C. and 2500° C. or lower) exceeding a baking temperature. Specifically, examples of the above-described metals include, for example, Cu, Ag, Ni, W, Mo, Au, Pt, Pd and the like. These metals may be used either alone or in combination of two or more thereof. The metal particles may be a combination of different kinds of metal particles, and may be formed of an alloy in which two or more kinds of metals are combined, as long as the melting point thereof is a temperature equivalent to or higher than the baking temperature. Of these metals, at least one kind of metal selected from the group consisting of Cu, Ag and Ni or an alloy containing this metal is preferred.

Of these metal particles, a Cu particle (melting point: 1083° C.) and an Ag particle (melting point: 960° C.) are preferred from the standpoints of excellent conductivity, relatively low melting point and particles which are easily sintered with one another at a baking temperature of 800 to 950° C., and the Cu particle is particularly preferred from the standpoint of economic efficiency.

Examples of the shape of the high melting point metal particle include a spherical shape (true spherical shape or substantially spherical shape), an ellipsoidal (elliptic spherical) shape, a polygonal shape (such as a polygonal cone shape and polygonal square shape such as a square parallelepiped shape or a rectangular parallelepiped shape), a plate-like shape (such as a flat shape, a scale-like shape or a flake-like shape), a rod-like or bar-like shape, a fibrous shape, an acicular shape, an irregular shape and the like. The shape of the high melting point metal particle is usually spherical, ellipsoidal, polygonal, irregular or the like.

The center particle size or the average particle size (D50) of the high melting point metal particle is, for example, from 0.01 to 15 μm (for example, from 0.01 to 10 μm), preferably from 0.05 to 10 μm (for example, from 0.1 to 7 μm), and more preferably from 0.3 to 1 μm (particularly, from 0.4 to 0.8 μm) or so, from the standpoint that pattern shape retainability and adhesion to the ceramic substrate can be compatible with each other. In an application in which the pattern shape retainability is important, the center particle size of the high melting point metal particle may be, for example, from about 0.01 to 2 μm (particularly, from 0.05 to 1 μm), and in an application in which the adhesion to the ceramic substrate is important, the center particle size may be, for example, from about 0.2 to 10 μm (particularly, from 0.3 to 8 μm). When the particle size is too small, the economic efficiency is deteriorated, and dispersibility in the paste may also be reduced. When the particle size is too large, printability of the paste and dispersion uniformity may be deteriorated.

In the present description and claims, the center particle size means the average particle size measured by using a laser diffraction scattering type particle size distribution measuring device.

The melting point of the high melting point metal particle may be any as long as it is a temperature equivalent to or higher than the baking temperature. For example, it may be higher than 950° C. and 2500° C. or lower, preferably from 955 to 2000° C., and more preferably from 960 to 1500° C. (particularly, from 980 to 1200° C.) or so. When the melting point is too low, it may become difficult to form the pattern having a fine shape.

The high melting point metal particles can be produced by commonly used methods, and can be produced, for example, by various methods such as a wet reduction method, an electrolysis method, an atomizing method and a water atomizing method.

(Molten Metal Particle)

The molten metal particle contains the metal or alloy which melts at a temperature equivalent to or lower than the baking temperature and has a melting point of 700° C. or lower, and melts during the baking at a temperature equivalent to or lower than the baking temperature of the paste to be fluidized, thereby being able to improve bondability of the conductive part to the ceramic substrate. The metal or alloy may be any, as long as it has a melting point equivalent to or lower than the baking temperature and 700° C. or lower. The melting point is, for example, from 60 to 700° C., preferably from 80 to 600° C. (for example, from 100 to 500° C.), and more preferably from 120 to 400° C. or so.

The molten metal particle may contain the metal or alloy having a melting point of 700° C. or lower, but is preferably formed of only the metal or alloy having a melting point of 700° C. or lower, from the standpoint of fluidity.

Examples of the molten metal particle of metal particle include, for example, In, Sn, Bi, Pb, Zn, Al, Sb, Mg and the like. Examples of the molten metal particle of alloy particle include alloys containing the above-described metal species, and include, for example, alloy particles containing In, Sn, Bi, Pb, Zn, Al, Sb or Mg, and the like, such as Sn—Bi alloy particles, Sn—Pb alloy particles, Sn—Zn—Bi alloy particles, Au—Sn alloy particles, Sn—Ag—Cu alloy particles, Sn—Cu alloy particles, Sn—Sb alloy particles, Au—Sn alloy particles, Au—Ge alloy particles, Zn—Al—Ge alloy particles, Bi—Sn—In alloy particles, In—Sn alloy particles, Al—Si—Fe—Cu alloy particles and Ag—Cu—Zn—Sn alloy particles. Such alloy particles may be a solder powder used in a solder paste, and may be, for example, Sn-58Bi (melting point: about 140° C.), Sn-37Pb (melting point: 183° C.), Sn-8Zn-3Bi (melting point: about 190° C.), Au-90Sn (melting point: about 220° C.), Sn-3Ag-0.5Cu (melting point: about 220° C.), Sn-0.7Cu (melting point: about 230° C.), Sn-5Sb (melting point: about 235° C.), Au-20Sn (melting point: about 280° C.), Au-12Ge (melting point: 356° C.), Zn-5Al-0.1Ge (melting point: 382° C.), 32.5Bi-16.5Sn-51In (melting point: 62° C.), 52In-48Sn (117° C.), Al-12Si-0.8Fe-0.3Cu (melting point: 580° C.), 58Ag-22Cu-17Zn-5Sn (melting point: 650° C.) or the like. These molten metal particles may be used either alone or in combination of two or more thereof.

Of these alloy particles, the alloy particles containing In, Sn or Bi are preferred from the standpoints of the fluidity and the like. Further, from the standpoints of containing no harmful lead and easy availability of small-sized particles, Sn—Bi alloy particles such as Sn-58Bi, Sn—Ag—Cu alloy particles such as Sn-3Ag-0.5Cu and Au—Sn alloy particles such as Au-20Sn are preferred, and from the standpoints of the excellent fluidity and highly improving the bondability of the conductive part to the ceramic substrate, the Sn—Bi alloy particles or Sn—Ag—Cu alloy particles having a low melting point are preferred. Furthermore, from the standpoints that wettability (affinity) with the high melting point metal particles can be improved and that the pattern shape can be easily retained by adjusting the fluidity, an alloy containing a metal (Cu, Ag or the like) which forms the high melting point metal particles, for example, the Sn—Ag—Cu alloy, is particularly preferred.

The molten metal particle may further contain a molten metal particle (second molten metal particle) containing an alloy having a melting point exceeding 700° C. and equivalent to or lower than the baking temperature, within a range where the effects of the present invention are not impaired, in addition to the molten metal particle (first molten metal particle) having a melting point of 700° C. or lower. The fluidity of the first molten metal particle can be adjusted by combination with the second molten metal particle, and the bondability of the conductive part to the ceramic substrate and the fine pattern shape can be compatible with each other For example, the melting point of the second molten metal particle is higher than 700° C. and 880° C. or lower, preferably from 730 to 850° C., and more preferably from about 750 to 800° C. or so.

The second molten metal particle is not particularly limited, as long as the particle has such a melting point, and may be a metal particle of Ba (melting point: 717° C.), Ce (melting point: 785° C.) or the like or may be an alloy particle. An alloy particle containing the metal contained in the first molten metal particle is preferred, because the affinity with the first molten metal particle can be improved, and an alloy particle containing the metal (such as Cu or Ag) which forms the high melting point metal particle is also preferred, from the standpoint of being able to improve the wettability with the high melting point metal particles. Above all, it is particularly preferred that both the first and second molten metal particles are formed of an alloy containing the metal (such as Cu or Ag) which forms the high melting point metal particle. Examples of the preferred second molten metal particle include alloys containing Cu and/or Ag (for example, an Ag—Cu alloy and the like), for example, silver brazing filler material 72Ag-28Cu (melting point: about 780° C.) which is widely used as a brazing filler material paste, and the like.

The mass ratio of the first molten metal particle and the second molten metal particle can be selected from a range of the former/the latter=100/0 to 10/90 or so, and when the both particles are combined, the mass ratio is, for example, from 90/10 to 20/80, preferably from 70/30 to 30/70, and more preferably from 60/40 to 40/60 or so. When the ratio of the second molten metal particle is too large, bonding force between the substrate and the conductive part may be decreased.

The molten metal particle can be prepared by so-called atomizing methods in which gas, air, water or the like is blown to an alloy in a molten state to instantaneously perform pulverization and cooling solidification, thereby powdering the alloy, and the like. Of these methods, the molten metal particle may be a particle prepared by a water atomizing method of blowing water, from the standpoint of being able to prepare an alloy particle of micron order having a nearly true spherical shape.

Examples of the shape of the molten metal particle include, for example, a spherical shape (true spherical shape or substantially spherical shape), an ellipsoidal (elliptic spherical) shape, a polygonal shape (such as a polygonal cone shape and polygonal square shape such a square parallelepiped shape or a rectangular parallelepiped shape), a plate-like shape (such as a flat shape, a scale-like shape or a flake-like shape), a rod-like or bar-like shape, a fibrous shape, an irregular shape and the like. The shape of the molten metal particle is usually spherical, ellipsoidal, polygonal, irregular or the like.

The center particle size (D50) of the molten metal particle is, for example, from 0.01 to 30 µm, preferably from 0.1 to 25 µm, and more preferably from 0.5 to 20 µm (particularly, from 1 to 10 µm) or so. When the particle size is too small, the yield in preparation of the particle may be remarkably reduced to cause drastic cost increase. Conversely, when the particle size is too large, the ratio of the size of one particle during formation of the fine pattern is increased to deteriorate the uniformity in the pattern, which may cause the generation of defects such as pattern chipping or voids and uneven bonding to the substrate. In addition, when printing is performed using a mesh screen, this may cause mesh clogging.

The mass ratio of the high melting point metal particle and the molten metal particle is, for example, the high melting point metal particle/the molten metal particle=90/10 to 40/60, preferably from 85/15 to 45/55, and more preferably from 80/20 to 50/50 (particularly, from 75/25 to 60/40) or so. When the ratio of the molten metal particle is too large, the fluidity of the molten metal cannot be suppressed, which is liable to lead to the turning-up of a pattern edge due to baking contraction or oozing of the molten metal to the outside of the pattern. Conversely, when the ratio of the molten metal particle is too small, a solid-liquid contact interface acting as a reaction field of the ceramic substrate and the active metal component is decreased, and therefore, good bonding may not be obtained.

(Active Metal Particle)

Examples of the active metal contained in the active metal particle include, Ti, Zr and Hf which are metals of the group 4A in the periodic table. These active metals may be used either alone or in combination of two or more thereof. Of these active metals, Ti and/or Zr are preferred, and Ti is particularly preferred, from the standpoints of excellent activity in the baking step and being able to improve the bonding force between the ceramic substrate and the conductive part.

The active metal particle may be any as long as the particle contains the active metal, and may be formed of the above-described active metal alone. However, from the standpoint of excellent activity in the baking step, it is preferred that the particle is formed of a compound containing the active metal.

Examples of the active metal-containing compound include, but are not particularly limited to, titanium compounds [for example, titanium boride ($TiB_2$), titanium hydride ($TiH_2$), titanium sulfide ($TiS_2$), titanium tetrachloride ($TiCl_4$) and the like], zirconium compounds [for example, zirconium boride ($ZrB_2$), zirconium hydride ($ZrH_2$), zirconium sulfide ($ZrS_2$), zirconium tetrachloride ($ZrCl_4$), zirconium hydroxide ($Zr(OH)_4$) and the like], hafnium compounds [for example, hafnium boride ($HfB_2$), hafnium hydride ($HfH_2$), hafnium sulfide ($HfS_2$), hafnium tetrachloride ($HfCl_4$) and the like] and the like. Of these, titanium hydride ($TiH_2$), titanium boride ($TiB_2$) and zirconium hydride ($ZrH_2$) are preferred, from the standpoint of excellent activity in the baking step.

The active metal particle containing these active metals may be used either alone or in combination of two or more therefor, and at least one kind selected from the group consisting of titanium hydride particles, titanium boride particles and zirconium hydride particles is preferred.

Examples of the shape of the active metal particle include, for example, a spherical shape (true spherical shape or substantially spherical shape), an ellipsoidal (elliptic spherical) shape, a polygonal shape (such as a polygonal cone shape and a polygonal square shape such as a square parallelepiped shape or a rectangular parallelepiped shape), a plate-like shape (such as a flat shape, a scale-like shape or a flake-like shape), a rod-like or bar-like shape, a fibrous shape, an irregular shape and the like. The shape of the active metal particle is usually spherical, ellipsoidal, polygonal, irregular or the like.

The center particle size (D50) of the active metal particle is, for example, from 0.1 to 15 μm (for example, from 1 to 15 μm), preferably from 0.5 to 10 μm, and more preferably from 1 to 7 μm (particularly, from 3 to 6 μm) or so. The smaller particle size is preferred from the standpoint of uniformity of the paste. However, when the particle size is too small, the yield in preparation of the particle may be remarkably reduced to cause drastic cost increase. Conversely, when the particle size is too large, the ratio of the size of one particle during formation of the fine pattern is increased to deteriorate the uniformity in the pattern, which is liable to cause the generation of defects such as pattern chipping or voids and uneven bonding to the substrate. In addition, when printing is performed using a mesh screen, this may cause mesh clogging.

The ratio of the active metal particle is from 0.5 to 30 parts by mass, preferably from 1 to 20 parts by mass, and more preferably from 2 to 10 parts by mass (particularly, from 2.5 to 5 parts by mass) or so, based on 100 parts by mass of total of the high melting point metal particle and the molten metal particle. When the ratio of the active metal particle is too small, the bondability to the ceramic substrate may be deteriorated. Conversely, when the ratio is too large, the metallized film or a filled via itself may become brittle.

(Organic Vehicle)

The organic vehicle may be a conventional organic vehicle used as an organic vehicle of a conductive paste containing a metal particle, for example, an organic binder and/or an organic solvent. The organic vehicle may be either one of the organic binder and the organic solvent, but is usually a combination of the organic binder and the organic solvent (a solution of the organic binder with the organic solvent).

Examples of the organic binder include, but are not particularly limited to, for example, thermoplastic resins (such as olefinic resins, vinyl resins, acrylic resins, styrenic resins, polyether resins, polyester resins, polyamide resins and cellulose derivatives), thermosetting resins (such as thermosetting acrylic resins, epoxy resins, phenol resins, unsaturated polyester resins and polyurethane resins) and the like. These organic binders may be used either alone or in combination of two or more thereof. Of these organic binders, resins which are easily burned out during the baking process and produce a small amount of ash, for example, acrylic resins (such as polymethyl methacrylate and polybutyl methacrylate), cellulose derivatives (such as nitrocellulose, ethyl cellulose, butyl cellulose and cellulose acetate), polyethers (such as polyoxymethylene), rubbers (such as polybutadiene and polyisoprene) and the like are commonly used, and from the standpoints of heat decomposability and the like, poly(meth)acrylic $C_{1-10}$ alkyl esters such as polymethyl (meth)acrylate and polybutyl (meth)acrylate are preferred.

The organic solvent is not particularly limited, and may be any, as long as it is an organic compound which imparts appropriate viscosity to the paste and can be easily evaporated by drying treatment after application of the paste to the substrate, and may be an organic solvent having a high boiling point. Examples of such organic solvents include, aromatic hydrocarbons (such as p-xylene), esters (such as ethyl lactate), ketones (such as isophorone), amides (such as dimethylformamide), aliphatic alcohols (such as octanol, decanol and diacetone alcohol), cellosolves (such as methyl cellosolve and ethyl cellosolve), cellosolve acetates (such as ethyl cellosolve acetate and butyl cellosolve acetate), carbitols (such as carbitol, methyl carbitol and ethyl carbitol), carbitol acetates (ethyl carbitol acetate and butyl carbitol acetate), aliphatic polyhydric alcohols (ethylene glycol, diethylene glycol, dipropylene glycol, butanediol, triethylene glycol and glycerol), alicyclic alcohols [for example, cycloalkanols such as cyclohexanol; terpene alcohols (such as monoterpene alcohol) such as terpineol and dihydroterpineol], aromatic alcohols (such as m-cresol), aromatic carboxylic acid esters (such as dibutyl phthalate and dioctyl phthalate), nitrogen-containing heterocyclic compounds (such as dimethylimidazole and dimethylimidazolidinone) and the like. These organic solvents may be used either alone or in combination of two or more thereof. Of these organic solvents, alicyclic alcohols such as terpineol and $C_{1-4}$ alkyl cellosolve acetates such as butyl carbitol acetate are preferred, from the standpoints of the fluidity of the paste and the like.

When the organic binder and the organic solvent are combined with each other, the ratio of the organic binder is, for example, from 1 to 200 parts by mass, preferably from 10 to 100 parts by mass, and more preferably from 30 to 80 parts by mass or so, based on 100 parts of the binder, and from 5 to 80% by mass, preferably from 10 to 50% by mass, and more preferably from 15 to 40% by mass or so, based on the whole organic vehicle.

The volume ratio of the organic vehicle is, for example, from 10 to 80% by mass, preferably from 20 to 75% by mass, and more preferably from 30 to 70% by mass or so, based on the whole volume of the conductive paste. The mass ratio of the organic vehicle is, for example, from 1 to 200 parts by mass, preferably from 5 to 150 parts by mass, and more preferably from 10 to 100 parts by mass or so, based on 100 parts by mass of the conductive components (the total amount of the high melting point metal particle, the molten alloy particle and the active metal particle).

(Other Components)

The conductive paste may further contain a commonly used additive, within a range where the effects of the present invention are not impaired. Examples of the commonly used additives include inorganic binders (such as glass frits), curing agents (such as curing agents for acrylic resins), coloring agents (such as dyes and pigments), hue modifiers, dye fixing agents, gloss imparting agents, metal corrosion preventives, stabilizers (such as antioxidants and UV absorbers), surfactants or dispersants (such as anionic surfactants, cationic surfactants, nonionic surfactants and ampholytic surfactants), dispersion stabilizers, viscosity modifiers or rheology modifiers, humectants, thixotropy—imparting agents, leveling agents, defoaming agents, bactericides, fillers and the like. These other components may be used either alone or in combination of two or more thereof. The ratio of the other components can be selected according to the kind of component, and is usually about 10% by mass or less (for example, 0.01 to 10% by mass). Further, the conductive paste of the present invention does not have to contain the inorganic binder such as the glass frit.

[Production Method of Electronic Substrate]

The electronic substrate (electronic substrate with the conductive part) of the present invention is obtained through an adhesion step of adhering the above-described conductive paste to the ceramic substrate and a baking step of baking the above-described conductive paste adhered to the above-described ceramic substrate to form the conductive part.

In the adhesion step, an adhesion method of the conductive paste can be selected according to the kind of conductive substrate. In a surface metallized substrate or a through-hole wall-surface metallized substrate, the conductive paste may be applied to a surface of the substrate or inner walls of through holes, and in a via filling substrate, the conductive paste may be filled (via-filled) in front-to-back through holes. The conductive paste of the present invention is not contracted during the baking, and therefore, the shape can be retained after the baking in any kind of electronic substrate.

Examples of coating or filling methods of the conductive paste include printing methods such as a screen printing method, an inkjet printing method, a letterpress printing method (for example, such as a gravure printing method), a lithographic printing method, an offset printing method and a flexographic printing method, printing methods in which these printing methods are combined, a spin coating method, a dipping method, direct pressure-fitting methods such as a roll pressure-fitting method, a squeegee pressure-fitting method and a press pressure-fitting method and the like. Of these methods, the screen printing method and the like are preferred.

The paste adhered to the substrate may be naturally dried before the baking treatment, but may also be dried by heating. The heating temperature can be selected according to the kind of organic solvent, and the temperature is, for example, from 50 to 200° C., preferably from 80 to 180° C., and more preferably from 100 to 150° C. or so. The heating time is, for example, from 1 minute to 3 hours, preferably from 5 minutes to 2 hours, and more preferably from 10 minutes to 1 hour or so.

In the baking step, the baking temperature may be any, as long as it is equivalent to or higher than the baking temperature of the high melting point metal particle in the conductive paste. The baking temperature (highest arrival temperature) may be 500° C. or higher, for example, from 750 to 1000° C. (for example, from 780 to 980° C.), preferably from 800 to 950° C., and more preferably from 850 to 930° C. (particularly, from 880 to 920° C.) or so. The baking time (baking time at the highest arrival temperature) is, for example, from 1 minute to 3 hours, preferably from 3 minutes to 1 hour, and more preferably from 5 to 30 minutes or so. When the baking temperature is too low, the reaction does not sufficiently proceed, which may weaken the bonding force to the substrate. Conversely, when the baking temperature is too high, the fluidity of the molten component is increased to cause the turning-up, the contraction, the oozing and the like, which may deteriorate patternability.

An atmosphere of the baking can be selected according to the kind of metal particles, and is not particularly limited. The atmosphere may be any of air, a non-oxidizing gas (for example, nitrogen gas and the like), an inert gas (for example, argon gas, helium gas and the like) and vacuum. However, the non-oxidizing atmosphere and the inert gas atmosphere are preferred, from the standpoint that the electronic substrate can be produced at high productivity. In particular, in the present invention, the nitrogen atmosphere is particularly preferred, because the pattern can be strongly bonded to the substrate even in the nitrogen atmosphere.

The baking (particularly, the baking in the nitrogen atmosphere) may be performed using a batch furnace or a belt conveying type tunnel furnace.

For the conductive part (metallized film or via filling part) obtained by the baking, a surface thereof may be physically or chemically polished. Examples of physical polishing methods include buffing, lapping, polishing and the like.

Examples of chemical polishing methods (surface treating methods) include a method of soft-etching an outermost surface with a sodium persulfate aqueous solution or the like, and the like.

After the physical or chemical polishing, the surface of the metallized film or the via filling part may be plated. As plating methods, various plating methods can be used regardless of being electrolytic or electroless. Further, a metal species of a plating layer can be widely selected. For example, in order to improve solder bondability, wire bondability, bump bondability and the like, nickel-gold plating, nickel-palladium-gold plating, tin plating and solder plating may be used, and in order to reduce the resistance value by increasing the film, copper plating may be used. Further, in order to increase the reflectance, silver plating may be used.

Furthermore, the film may be increased by overlaying a commonly used conductive paste such as a copper paste or a silver paste on the above-described metallized film or via filling part.

In addition, when the electronic substrate is the via filling substrate or the through-hole wall-surface metallized substrate, the via filling part or the wall-surface metallized film is provided for the purpose of improving front-to-back conduction through the substrate or thermal conductivity. Electrode-wiring patterns formed on the substrate surface may be the conductive paste of the present invention, but may also be a commonly used conductive paste. For example, in the via filling substrate, only the via filling part may be formed by the conductive paste of the present invention, and the surface electrode and wiring may be formed by sputtering or the plating method.

[Electronic Substrate]

The electronic substrate of the present invention is obtained by the above-described production method, and includes a ceramic substrate and a conductive part containing a high melting point metal having a melting point equivalent to or higher than the baking temperature, a molten metal containing a metal or alloy having a melting point of 700° C. or lower, and an active metal.

A material of the ceramic substrate may be any as long as it is a ceramic with which the active metal can react, and examples thereof include metal oxides (such as quartz, alumina or aluminum oxide, zirconia, sapphire, ferrite, zinc oxide, niobium oxide, mullite and beryllia), silicon oxides (such as silicon dioxide), metal nitrides (such as aluminum nitride and titanium nitride), silicon nitride, boron nitride, carbon nitride, metal carbides (such as titanium carbide and tungsten carbide), silicon carbide, boron carbide, metal double oxides [such as metal titanates (such as barium titanate, strontium titanate, lead titanate, niobium titanate, calcium titanate and magnesium titanate), metal zirconates (such as barium zirconate, calcium zirconate and lead zirconate) and the like] and the like. These ceramics may be used either alone or in combination of two or more thereof.

Of these ceramic substrates, the alumina substrate, the alumina-zirconia substrate, the aluminum nitride substrate, the silicon nitride substrate and the silicon carbide are preferred, from the standpoint of high reliability in electric and electronic fields, and the alumina substrate, the aluminum nitride substrate and the silicon nitride substrate are particularly preferred, from the standpoints of higher heat resistance and the large effect of improving the bonding force to the high melting point metal such as a Cu particle or an Ag particle.

The thickness of the ceramic substrate may be appropriately selected according to an application, and may be, for example, from 0.001 to 10 mm, preferably from 0.01 to 5 mm, and more preferably from 0.05 to 3 mm (particularly, from 0.1 to 1 mm) or so.

EXAMPLES

The present invention is described below in more detail based on Examples, but the present invention should not be construed as being limited by these Examples. In the following examples, materials used in Examples, patterns of a substrate for evaluation, and evaluation methods of resulting electronic substrates are shown below.

[Materials Used]

(High Melting Point Metal Particle)

Cu particle A: Copper particle having a center particle size of 0.1 μm and a melting point of 1085° C.

Cu particle B: Copper particle having a center particle size of 0.5 μm and a melting point of 1085° C.

Cu particle C: Copper particle having a center particle size of 3 μm and a melting point of 1085° C.

Cu particle D: Copper particle having a center particle size of 7 μm and a melting point of 1085° C.

Cu particle E: Copper particle having a center particle size of 15 μm and a melting point of 1085° C.

Ag particle: Silver particle having a center particle size of 0.5 μm and a melting point of 962° C.

Ni particle: Nickel particle having a center particle size of 0.7 μm and a melting point of 1455° C.

(Molten Metal Particle)

Sn particle: Tin particle having a center particle size of 8 μm and a melting point of 232° C.

Bi particle: Bismuth particle having a center particle size of 16 μm and a melting point of 271° C.

In particle: Indium particle having a center particle size of 25 μm and a melting point of 156° C.

SnAgCu particle: Sn—Ag—Cu alloy particle having a center particle size of 5 μm and a melting point of 220° C.

SnBi particle: Sn—Bi alloy particle having a center particle size of 5 μm and a melting point of 140° C.

AuSn particle: Au—Sn alloy particle having a center particle size of 5 μm and a melting point of 280° C.

Zn particle: Zinc particle having a center particle size of 7 μm and a melting point of 419° C.

Al particle: Aluminum particle having a center particle size of 7 μm and a melting point of 660° C.

AgCuZnSn particle: 58Ag-22Cu-17Zn-5Sn alloy particle having a center particle size of 5 μm and a melting point of 650° C.

AgCu particle: Ag—Cu alloy particle having a center particle size of 5 μm and a melting point of 780° C.

(Active Metal Particle)

Titanium hydride (TiH$_2$) particle: Titanium hydride particle having a center particle size of 6 μm Titanium boride (TiB$_2$) particle: Titanium boride particle having a center particle size of 3 μm Zirconium hydride (ZrH$_2$) particle: Zirconium hydride particle having a center particle size of 5 μm (Organic Vehicle)

Organic binder: Polybutyl methacrylate

Organic solvent: Terpineol

[Patterns of Substrate for Evaluation]

A sample in which 2 mm×2 mm size square patterns were arranged side by side longitudinally and laterally on a surface of a 50.8 mm×50.8 mm ceramic substrate was used as an evaluation substrate. The patterns were connected with a thin wire to be able to perform electroplating.

[Evaluation of Electronic Substrate]

(Pattern Shape)

The appearance of the electronic substrate (2 mm×2 mm size square patterns) after the baking was observed visually and with a loupe (15× magnification), and the patterns in which the shape was retained without being deformed were further subjected to image measurement and evaluated by the following criteria.

B (edge turning-up): The edge part of the pattern is turned up.

B (contraction): The edge part of the pattern is not turned up, but the square shape is deformed to cause the edge part to become round, or the size is reduced.

A (good): The shape of the 2 mm×2 mm pattern is retained without being deformed, but when the image measurement is further performed, the size is not within a range of 1.97 mm×1.97 mm to 2.03 mm×2.03 mm.

S (especially good): The shape of the 2 mm×2 mm pattern is retained without being deformed, and further, in the image measurement, the size of the 2 mm×2 mm pattern is within a range of 1.97 mm×1.97 mm to 2.03 mm×2.03 mm, without being substantially changed.

[Peel Strength Test and Fracture State]

The electronic substrate having a good pattern shape was subjected to a peel strength test. A tin-plated copper wire (peel wire) was laid along an upper surface of the 2 mm×2 mm square pattern (passing a center part of the square shape, along and in parallel to a side thereof), followed by soldering. Thereafter, the peel wire was bent at 90 degrees at the outside of the 2 mm pattern, and pulled vertically upward to the substrate surface to peel off the film, thereby measuring the peel strength. The highest strength when being fractured was recorded as the peel strength. In addition, a fractured place after the test was observed, and a fracture state was evaluated by the following criteria.

S (substrate fracture): The substrate is fractured to be gouged out, and the peel strength is 4 kg or more.

A (substrate fracture): The substrate is fractured to be gouged out, and the peel strength is 2 kg or more and less than 4 kg.

A (interface fracture): The fracture occurs at an interface between the substrate and the metallized film, and the peel strength is 2 kg or more.

B (interface fracture): The fracture occurs at an interface between the substrate and the metallized film, and the peel strength is less than 2 kg.

B (intra-film fracture): The metallized film is crumbly, the fracture occurs in the inside of the film, and the peel strength is less than 2 kg.

[Overall Judgment]

The evaluation results of the pattern shape and the peel strength test were overall judged by the following criteria.

S: Both the pattern shape and the peel strength are judged as "S".

A: Both the pattern shape and the peel strength are judged as "A", or one is judged as "S" and the other as "A".

B: Either the pattern shape or the peel strength is judged as "B".

Example 1

A paste 1 prepared by the composition shown in Table 1 was printed into the above-described evaluation patterns by screen printing, and thereafter, baked in a tunnel furnace in which the atmosphere was substituted with nitrogen. As the ceramic substrate, an aluminum nitride substrate was used. The baking was performed at a highest temperature of 900° C., and this temperature was retained for 10 minutes. The time from charging into the furnace to recovering including the temperature rising and falling time was about 60 minutes. A metallized film of the baked substrate which came out of the furnace was observed. As a result, the shape thereof was good. A surface of the baked metallized film was buffed, and then, electrolytic nickel-gold plating was applied to the surface. A resulting electronic substrate was subjected to the peel strength test. As a result, the fracture mode was substrate fracture, and the substrate and the metallized film were bonded to each other at a high strength equivalent to or higher than the substrate strength to show sufficient bondability.

Examples 2 to 9

Electronic substrates were obtained in the same manner as in Example 1 except for changing the molten metal particle in the paste, using pastes 2 to 9 shown in Table 1 in place of the paste 1. For the resulting electronic substrates, the good results were obtained in both the pattern shape and the peel test. However, in relative evaluation with Example 1, although the results in Example 4 were the same as in Example 1, the pattern shape in Examples 2 and 6 was slightly deteriorated, and the peel strength in Examples 3, 5 and 7 to 9 was slightly decreased.

Examples 10 and 11

Electronic substrates were obtained in the same manner as in Example 1 except for changing the proportion of the active metal particle in the paste, using pastes 10 and 11 shown in Table 1 in place of the paste 1. For the resulting electronic substrates, the good results were obtained in both the pattern shape and the peel test. However, in relative evaluation with Example 1, both the pattern shape and the peel strength in Example 10 were slightly deteriorated, and the peel strength in Example 11 was slightly decreased.

Examples 12 to 14

Electronic substrates were obtained in the same manner as in Example 1 except for replacing the molten metal particle in the paste with two kinds of molten metal particles shown in Table 1, using pastes 12 to 14 shown in Table 1 in place of the paste 1. For the resulting electronic substrates, the good results were obtained in both the pattern shape and the peel test. For details, the results in Example 12 were the same as in Example 1 in both the pattern shape and the peel strength. In Example 13, the pattern shape was improved as compared to that in Example 2, probably because the fluidity was adjusted within an appropriate range by combining the molten metal particle having a melting point of higher than 700° C. with the molten metal particle having a melting point of 400° C. or lower. Furthermore, the results in Example 14 were the same as in Example 3 in both the pattern shape and the peel strength.

Examples 15 to 18

Electronic substrates were obtained in the same manner as in Example 1 except for changing the particle size of the high melting point metal particle in the paste, using pastes 15 to 18 shown in Table 1 in place of the paste 1. For the resulting electronic substrates, the good results were obtained in both the pattern shape and the peel test. However, in relative evaluation with Example 1, the peel strength in Example 15 was slightly decreased, the pattern shape in Examples 16 and 17 was slightly deteriorated, and both the pattern shape and the peel strength in Example 18 were slightly deteriorated.

Examples 19 and 20

Electronic substrates were obtained in the same manner as in Example 1 except for changing the high melting point metal particle in the paste, using pastes 19 and 20 shown in Table 2 in place of the paste 1. For the resulting electronic substrates, the same good results as in Example 1 were obtained in both the pattern shape and the peel test.

Examples 21 and 22

Electronic substrates were obtained in the same manner as in Example 1 except for changing the ratio of the high melting point metal particle and the molten alloy particle in the paste, using pastes 21 to 22 shown in Table 2 in place of the paste 1. For the resulting electronic substrates, the good results were obtained in both the pattern shape and the peel test. However, in relative evaluation with Example 1, the peel strength in Example 21 was slightly decreased, and the pattern shape in Example 22 was slightly deteriorated.

Examples 23 and 24

Electronic substrates were obtained in the same manner as in Example 1 except for changing the active metal particle in the paste, using pastes 23 and 24 shown in Table 2 in place of the paste 1. For the resulting electronic substrates, the good results were obtained in both the pattern shape and the peel test. However, in relative evaluation with Example 1, the peel strength in both Examples was slightly decreased.

Examples 25 and 26

Electronic substrates were obtained in the same manner as in Example 4 except for changing the high melting point metal particle in the paste, using pastes 25 and 26 shown in Table 2 in place of the paste 4. For the resulting electronic substrates, the same good results as in Examples 1 and 4 were obtained in both the pattern shape and the peel test.

Example 27

An electronic substrate was obtained in the same manner as in Example 4 except for changing the active metal particle in the paste, using a paste 27 shown in Table 2 in place of the paste 4. For the resulting electronic substrate, the good results were obtained in both the pattern shape and the peel test. However, in relative evaluation with Examples 1 and 4, the peel strength was slightly decreased.

Examples 28 and 29

Electronic substrates were obtained in the same manner as in Example 1 except for changing the kind of ceramic substrate to alumina or silicon nitride without changing the paste. For the resulting electronic substrates, the same good results as in Example 1 were obtained in both the pattern shape and the peel test.

Examples 30 to 32

Electronic substrates were obtained in the same manner as in Example 1 except for changing the baking temperature.

For the resulting electronic substrates, the good results were obtained in both the pattern shape and the peel test. For the resulting electronic substrates, in Example 31 in which the baking temperature was 850° C., the same results as in Example 1 were obtained in both the pattern shape and the peel test, but in Example 30 in which the baking temperature was 800° C., the peel strength was slightly decreased as compared to that in Example 1, and in Example 32 in which the baking temperature was 950° C., the pattern shape was slightly deteriorated as compared to that in Example 1.

Examples 33 and 34

Electronic substrates were obtained in the same manner as in Example 4 except for changing the kind of ceramic substrate to alumina or silicon nitride without changing the paste. For the resulting electronic substrates, the good results were obtained in both the pattern shape and the peel test. In Example 34 in which silicon nitride was used as the ceramic substrate, the same results as in Example 4 were obtained in both the pattern shape and the peel test, but in Example 33 in which alumina was used as the ceramic substrate, the peel strength was slightly decreased.

Comparative Examples 1 to 3

Electronic substrates were obtained in the same manner as in Example 1 except for changing the amount of only the Ag—Cu alloy particle having a melting point of 780° C. without using the alloy having a melting point of 700° C. or lower, using pastes 28 to 30 shown in Table 2 in place of the paste 1. In Comparative Example 1, the pattern shape was good, but the peel strength was low, resulting in failure to obtain sufficient bonding. As the ratio of the Ag—Cu alloy particle was increased, the pattern shape was deteriorated, and the edge turning-up or the contraction occurred. From these results, when only the molten metal component having a high melting point was used, the electronic substrate having the good pattern shape and the excellent bondability to the substrate was not obtained.

The evaluation results of the electronic substrates obtained in Examples and Comparative Examples are shown in Table 3.

TABLE 1

| | | Melting point | Average particle size | Paste No. (parts by mass) | | | | | | | | | | | | | | | | | |
|---|---|---|---|---|---|---|---|---|---|---|---|---|---|---|---|---|---|---|---|---|---|
| | | | | 1 | 2 | 3 | 4 | 5 | 6 | 7 | 8 | 9 | 10 | 11 | 12 | 13 | 14 | 15 | 16 | 17 | 18 |
| High melting point metal particle | Cu particle A | 1085° C. | 0.1 μm | | | | | | | | | | | | | | | 70 | | | |
| | Cu particle B | 1085° C. | 0.5 μm | 70 | 70 | 70 | 70 | 70 | 70 | 70 | 70 | 70 | 70 | 70 | 70 | 70 | 70 | | | | |
| | Cu particle C | 1085° C. | 3 μm | | | | | | | | | | | | | | | | 70 | | |
| | Cu particle D | 1085° C. | 7 μm | | | | | | | | | | | | | | | | | 70 | |
| | Cu particle E | 1085° C. | 15 μm | | | | | | | | | | | | | | | | | | 70 |
| | Ag particle | 962° C. | 0.5 μm | | | | | | | | | | | | | | | | | | |
| | Ni particle | 1455° C. | 0.7 μm | | | | | | | | | | | | | | | | | | |
| Molten metal particle | SnAgCu particle | 220° C. | 5 μm | 30 | | | | | | | | | 30 | 30 | 15 | | | 30 | 30 | 30 | 30 |
| | SnBi particle | 140° C. | 5 μm | | 30 | | | | | | | | | | | 15 | | | | | |
| | AuSn particle | 280° C. | 5 μm | | | 30 | | | | | | | | | | | 15 | | | | |
| | Sn particle | 232° C. | 8 μm | | | | 30 | | | | | | | | | | | | | | |
| | Bi particle | 271° C. | 16 μm | | | | | 30 | | | | | | | | | | | | | |
| | In particle | 156° C. | 25 μm | | | | | | 30 | | | | | | | | | | | | |
| | Zn particle | 419° C. | 7 μm | | | | | | | 30 | | | | | | | | | | | |
| | Al particle | 660° C. | 7 μm | | | | | | | | 30 | | | | | | | | | | |
| | AgCuZnSn particle | 650° C. | 5 μm | | | | | | | | | 30 | | | | | | | | | |
| | AgCu particle | 780° C. | 5 μm | | | | | | | | | | | | 15 | 15 | 15 | | | | |
| Active metal particle | TiH₂ particle | — | 6 μm | 3 | 3 | 3 | 3 | 3 | 3 | 3 | 3 | 3 | 1 | 30 | 3 | 3 | 3 | 3 | 3 | 3 | 3 |
| | TiB₂ particle | — | 3 μm | | | | | | | | | | | | | | | | | | |
| | ZrH₂ particle | — | 5 μm | | | | | | | | | | | | | | | | | | |
| Organic vehicle | Binder | — | — | 5 | 5 | 5 | 5 | 5 | 5 | 5 | 5 | 5 | 5 | 5 | 5 | 5 | 5 | 5 | 5 | 5 | 5 |
| | Solvent | — | — | 10 | 10 | 10 | 10 | 10 | 10 | 10 | 10 | 10 | 10 | 10 | 10 | 10 | 10 | 10 | 10 | 10 | 10 |

TABLE 2

| | | Melting point | Average particle size | Paste No. (parts by mass) | | | | | | | | | | | |
|---|---|---|---|---|---|---|---|---|---|---|---|---|---|---|---|
| | | | | 19 | 20 | 21 | 22 | 23 | 24 | 25 | 26 | 27 | 28 | 29 | 30 |
| High melting point metal particle | Cu particle A | 1085° C. | 0.1 μm | | | | | | | | | | | | |
| | Cu particle B | 1085° C. | 0.5 μm | | | | 90 | 50 | 70 | 70 | | | 70 | 70 | 50 | 30 |
| | Cu particle C | 1085° C. | 3 μm | | | | | | | | | | | | |
| | Cu particle D | 1085° C. | 7 μm | | | | | | | | | | | | |
| | Cu particle E | 1085° C. | 15 μm | | | | | | | | | | | | |
| | Ag particle | 962° C. | 0.5 μm | 70 | | | | | | 70 | | | | | |
| | Ni particle | 1455° C. | 0.7 μm | | 70 | | | | | | 70 | | | | |
| Molten metal particle | SnAgCu particle | 220° C. | 5 μm | 30 | 30 | 10 | 50 | 30 | 30 | | | | | | |
| | SnBi particle | 140° C. | 5 μm | | | | | | | | | | | | |
| | AuSn particle | 280° C. | 5 μm | | | | | | | | | | | | |
| | Sn particle | 232° C. | 8 μm | | | | | | | | | 30 | 30 | 30 | |
| | Bi particle | 271° C. | 16 μm | | | | | | | | | | | | |
| | In particle | 156° C. | 25 μm | | | | | | | | | | | | |
| | Zn particle | 419° C. | 7 μm | | | | | | | | | | | | |

TABLE 2-continued

| | | Melting point | Average particle size | Paste No. (parts by mass) | | | | | | | | | | | |
|---|---|---|---|---|---|---|---|---|---|---|---|---|---|---|---|
| | | | | 19 | 20 | 21 | 22 | 23 | 24 | 25 | 26 | 27 | 28 | 29 | 30 |
| | Al particle | 660° C. | 7 μm | | | | | | | | | | | | |
| | AgCuZnSn particle | 650° C. | 5 μm | | | | | | | | | | | | |
| | AgCu particle | 780° C. | 5 μm | | | | | | | | | | 30 | 50 | 70 |
| Active metal particle | $TiH_2$ particle | — | 6 μm | 3 | 3 | 3 | 3 | | | 3 | 3 | | 3 | 3 | 3 |
| | $TiB_2$ particle | — | 3 μm | | | | | 3 | | | | | | | |
| | $ZrH_2$ particle | — | 5 μm | | | | | | 3 | | | 3 | | | |
| Organic vehicle | Binder | — | — | 5 | 5 | 5 | 5 | 5 | 5 | 5 | 5 | 5 | 5 | 5 | 5 |
| | Solvent | — | — | 10 | 10 | 10 | 10 | 10 | 10 | 10 | 10 | 10 | 10 | 10 | 10 |

TABLE 3

| | Paste | Substrate | Baking Temp. | Pattern shape | Peel strength | Fracture state | Overall judgment |
|---|---|---|---|---|---|---|---|
| Ex. 1 | Paste 1 | Aluminum nitride | 900° C. | S (especially good) | 4.5 kg | S (substrate fracture) | S |
| Ex. 2 | Paste 2 | Aluminum nitride | 900° C. | A (good) | 5.2 kg | S (substrate fracture) | A |
| Ex. 3 | Paste 3 | Aluminum nitride | 900° C. | S (especially good) | 3.7 kg | A (substrate fracture) | A |
| Ex. 4 | Paste 4 | Aluminum nitride | 900° C. | S (especially good) | 4.1 kg | S (substrate fracture) | S |
| Ex. 5 | Paste 5 | Aluminum nitride | 900° C. | S (especially good) | 3.3 kg | A (substrate fracture) | A |
| Ex. 6 | Paste 6 | Aluminum nitride | 900° C. | A (good) | 4.7 kg | S (substrate fracture) | A |
| Ex. 7 | Paste 7 | Aluminum nitride | 900° C. | S (especially good) | 3.1 kg | A (interface fracture) | A |
| Ex. 8 | Paste 8 | Aluminum nitride | 900° C. | S (especially good) | 2.8 kg | A (interface fracture) | A |
| Ex. 9 | Paste 9 | Aluminum nitride | 900° C. | S (especially good) | 3.0 kg | A (interface fracture) | A |
| Ex. 10 | Paste 10 | Aluminum nitride | 900° C. | A (good) | 2.3 kg | A (interface fracture) | A |
| Ex. 11 | Paste 11 | Aluminum nitride | 900° C. | S (especially good) | 3.9 kg | A (substrate fracture) | A |
| Ex. 12 | Paste 12 | Aluminum nitride | 900° C. | S (especially good) | 5.0 kg | S (substrate fracture) | S |
| Ex. 13 | Paste 13 | Aluminum nitride | 900° C. | S (especially good) | 5.0 kg | S (substrate fracture) | S |
| Ex. 14 | Paste 14 | Aluminum nitride | 900° C. | S (especially good) | 3.5 kg | A (substrate fracture) | A |
| Ex. 15 | Paste 15 | Aluminum nitride | 900° C. | S (especially good) | 3.1 kg | A (interface fracture) | A |
| Ex. 16 | Paste 16 | Aluminum nitride | 900° C. | A (good) | 5.1 kg | S (substrate fracture) | A |
| Ex. 17 | Paste 17 | Aluminum nitride | 900° C. | A (good) | 4.7 kg | S (substrate fracture) | A |
| Ex. 18 | Paste 18 | Aluminum nitride | 900° C. | A (good) | 2.6 kg | A (interface fracture) | A |
| Ex. 19 | Paste 19 | Aluminum nitride | 900° C. | S (especially good) | 5.1 kg | S (substrate fracture) | S |
| Ex. 20 | Paste 20 | Aluminum nitride | 900° C. | S (especially good) | 4.1 kg | S (substrate fracture) | S |
| Ex. 21 | Paste 21 | Aluminum nitride | 900° C. | S (especially good) | 2.9 kg | A (interface fracture) | A |
| Ex. 22 | Paste 22 | Aluminum nitride | 900° C. | A (good) | 5.5 kg | S (substrate fracture) | A |
| Ex. 23 | Paste 23 | Aluminum nitride | 900° C. | S (especially good) | 2.4 kg | A (interface fracture) | A |
| Ex. 24 | Paste 24 | Aluminum nitride | 900° C. | S (especially good) | 3.0 kg | A (interface fracture) | A |
| Ex. 25 | Paste 25 | Aluminum nitride | 900° C. | S (especially good) | 4.4 kg | S (substrate fracture) | S |
| Ex. 26 | Paste 26 | Aluminum nitride | 900° C. | S (especially good) | 4.6 kg | S (substrate fracture) | S |
| Ex. 27 | Paste 27 | Aluminum nitride | 900° C. | S (especially good) | 2.3 kg | A (interface fracture) | A |
| Ex. 28 | Paste 1 | Alumina | 900° C. | S (especially good) | 5.8 kg | S (substrate fracture) | S |
| Ex. 29 | Paste 1 | Silicon nitride | 900° C. | S (especially good) | 5.1 kg | S (substrate fracture) | S |

TABLE 3-continued

| | Paste | Substrate | Baking Temp. | Pattern shape | Peel strength | Fracture state | Overall judgment |
|---|---|---|---|---|---|---|---|
| Ex. 30 | Paste 1 | Aluminum nitride | 800° C. | S (especially good) | 2.8 kg | A (interface fracture) | A |
| Ex. 31 | Paste 1 | Aluminum nitride | 850° C. | S (especially good) | 4.6 kg | S (substrate fracture) | S |
| Ex. 32 | Paste 1 | Aluminum nitride | 950° C. | A (good) | 4.8 kg | S (substrate fracture) | A |
| Ex. 33 | Paste 4 | Alumina | 900° C. | S (especially good) | 3.5 kg | A (substrate fracture) | A |
| Ex. 34 | Paste 4 | Silicon nitride | 900° C. | S (especially good) | 4.6 kg | S (substrate fracture) | S |
| Comp. Ex. 1 | Paste 28 | Aluminum nitride | 900° C. | A (good) | 1.4 kg | B (interface fracture) | B |
| Comp. Ex. 2 | Paste 29 | Aluminum nitride | 900° C. | B (edge turning-up) | | | B |
| Comp. Ex. 3 | Paste 30 | Aluminum nitride | 900° C. | B (contraction) | | | B |

While the present invention has been described in detail with reference to specific embodiments thereof, it will be apparent to one skilled in the art that various changes and modifications can be made therein without departing from the spirit and scope of the present invention.

The present application is based on Japanese Patent Application No. 2015-191402 filed on Sep. 29, 2015, Japanese Patent Application No. 2016-179636 filed on Sep. 14, 2016, and Japanese Patent Application No. 2016-249642 filed on Dec. 22, 2016, the contents of which are incorporated herein by reference.

INDUSTRIAL APPLICABILITY

The conductive paste of the present invention can be utilized for circuit substrates, electronic parts, substrates of semiconductor packages and the like, and can be particularly effectively utilized as a paste for forming conductive parts of electronic substrates.

The invention claimed is:

1. A conductive paste comprising:
a high melting point metal particle having a melting point exceeding a baking temperature;
a molten metal particle containing a metal or an alloy which melts at a temperature equivalent to or lower than the baking temperature and has a melting point of 700° C. or lower;
an active metal particle containing an active metal; and
an organic vehicle.

2. The conductive paste according to claim 1, wherein the molten metal particle is a metal particle of at least one kind selected from the group consisting of In, Sn, Bi, Pb, Zn, Al, Sb and Mg, or an alloy particle containing at least one kind of these metal species.

3. The conductive paste according to claim 2, wherein the molten metal particle contains at least one kind selected from the group consisting of an Sn—Ag—Cu alloy particle, an Sn—Bi alloy particle and an Au—Sn alloy particle.

4. The conductive paste according to claim 1, wherein the active metal is Ti and/or Zr.

5. The conductive paste according to claim 4, wherein the active metal particle is at least one kind selected from the group consisting of a titanium hydride particle, a titanium boride particle and a zirconium hydride particle.

6. The conductive paste according to claim 1, wherein the high melting point metal particle is formed by at least one kind of metal selected from the group consisting of Cu, Ag and Ni, or an alloy containing this metal.

7. The conductive paste according to claim 1, wherein a mass ratio of the high melting point metal particle and the molten metal particle is high melting point metal particle/molten metal particle=90/10 to 40/60.

8. The conductive paste according to claim 1, wherein a ratio of the active metal particle is from 0.5 to 30 parts by mass based on 100 parts by mass of total of the high melting point metal particle and the molten metal particle.

9. The conductive paste according to claim 1, wherein a center particle size of the molten metal particle is from 0.01 to 30 μm.

10. The conductive paste according to claim 1, wherein a center particle size of the active metal particle is from 0.1 to 15 μm.

11. The conductive paste according to claim 1, wherein a center particle size of the high melting point metal particle is from 0.01 to 15 μm.

12. A method for producing an electronic substrate, the method comprising an adhesion step of adhering the conductive paste according to claim 1 to a ceramic substrate, and a baking step of baking the conductive paste adhered to the ceramic substrate to form a conductive part.

13. The production method according to claim 12, wherein in the baking step, the conductive paste is baked in a non-oxidizing atmosphere or an inert atmosphere.

14. The production method according to claim 13, wherein in the baking step, the conductive paste is baked in a nitrogen atmosphere.

15. The production method according to claim 12, wherein in the baking step, a baking temperature is from 800 to 950° C.

16. An electronic substrate comprising a ceramic substrate and a conductive part containing a high melting point metal having a melting point equivalent to or higher than a baking temperature, a molten metal which contains a metal or an alloy having a melting point of 700° C. or lower and an active metal.

17. The electronic substrate according to claim 16, wherein the ceramic substrate is an alumina substrate, an alumina-zirconia substrate, an aluminum nitride substrate, a silicon nitride substrate or a silicon carbide substrate.

18. The electronic substrate according to claim 16, wherein the electronic substrate is a surface metallized substrate, a via filling substrate or a through-hole wall-surface metallized substrate.

* * * * *